(12) United States Patent
Li (10) Patent No.: US 8,253,383 B2
(45) Date of Patent: Aug. 28, 2012

(54) CIRCUITS AND METHODS FOR MONITORING MULTI-CELL BATTERY PACKS

(75) Inventor: Guo Xing Li, Sunnyvale, CA (US)

(73) Assignee: O2Micro Inc, Santa Clara, CA (US)

( * ) Notice: Subject to any disclaimer, the term of this patent is extended or adjusted under 35 U.S.C. 154(b) by 471 days.

(21) Appl. No.: 12/366,084

(22) Filed: Feb. 5, 2009

(65) Prior Publication Data
US 2010/0194345 A1    Aug. 5, 2010

(51) Int. Cl.
*G01N 27/27*    (2006.01)
*H02J 7/00*    (2006.01)

(52) U.S. Cl. ........................ 320/134; 320/162
(58) Field of Classification Search ............... None
See application file for complete search history.

(56) References Cited

U.S. PATENT DOCUMENTS

| 5,703,503 A |   | 12/1997 | Miyamoto et al. |
| 5,867,007 A | * | 2/1999 | Kim ........................... 320/118 |
| 6,091,226 A |   | 7/2000 | Amano |
| 6,452,362 B1 | * | 9/2002 | Choo ........................... 320/116 |
| 6,518,726 B1 | * | 2/2003 | Nowlin et al. ................ 320/128 |
| 7,719,284 B2 | * | 5/2010 | Ohta et al. ................... 324/434 |
| 2007/0135069 A1 |   | 6/2007 | Soler Garrido et al. |

FOREIGN PATENT DOCUMENTS

| JP | H07-105986 A | 4/1995 |
| JP | 8321747 A | 12/1996 |
| JP | H09-318679 A | 12/1997 |
| JP | 11178225 A | 7/1999 |
| JP | H11-260423 A | 9/1999 |
| JP | 2002181853 A | 6/2002 |
| JP | 2005073498 A | 3/2005 |
| JP | 2007110708 A | 4/2007 |

* cited by examiner

*Primary Examiner* — Vinh Nguyen (57) ABSTRACT

A voltage detection circuit can include a status sensing network and a comparing network. The status sensing network can simultaneously detect a cell voltage for each battery cell of a plurality of battery cells. The comparing network can simultaneously compare the detected cell voltages with a predetermined voltage threshold by comparing the maximum of the cell voltages with a first (high-voltage) threshold, and by comparing the minimum of the cell voltages with a second (low-voltage) threshold. The comparing network can also generate an indication signal when a cell voltage does not satisfy the respective voltage threshold.

20 Claims, 6 Drawing Sheets

CIRCUITS AND METHODS FOR MONITORING MULTI-CELL BATTERY PACKS

TECHNICAL FIELD

Embodiments of the present invention relate to battery protection circuits, and more particularly, to circuits for detecting charging status and discharging status of a multi-cell rechargeable battery pack.

BACKGROUND

Rechargeable batteries can provide electrical power without the constraint of a power cord. They are widely used in portable devices such as cell phones, personal digital assistants (PDAs), laptops, and power tools, and now even can be used in electrical vehicles. The rechargeable batteries may be nickel-cadmium (NiCd), nickel-metal hydride (NiMH), or lithium ion (LiIon).

A plurality of battery cells can be coupled to each other in series so as to form a multi-cell battery pack. The battery pack can be recharged by a DC power source, such as an AC/DC adapter, and can be discharged through a load, such as a resistor. If the charging voltage across a battery cell exceeds a high-voltage threshold, the battery pack may be burned or even explode. If the discharging voltage across a battery cell drops below a low-voltage threshold, the battery pack may also be hazardous.

SUMMARY

An object of the present invention is to prevent a battery pack from over-voltage charging and under-voltage discharging.

In one embodiment, a voltage detection circuit includes a status sensing network and a comparing network. The status sensing network can simultaneously detect a cell voltage for each battery cell of a plurality of battery cells. The comparing network can simultaneously compare the detected cell voltages with a predetermined voltage threshold by comparing the extremum of the cell voltages with a respective predetermined voltage threshold. More specifically, in one embodiment, the comparing network compares the maximum of the cell voltages with a first (high-voltage) threshold; in another embodiment, the comparing network also compares the minimum of the cell voltages with a second (low-voltage) threshold. The comparing network can also generate an indication signal when a cell voltage does not satisfy the respective voltage threshold.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention, a multi-cell battery pack protection circuit. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

As used herein, the term "extremum" refers to value that may be either the maximum value or the minimum value of a given set of values.

In one embodiment, a detection circuit is provided to detect multi-cell voltages and to monitor the voltages against a high-threshold and/or a low-threshold. Instead of comparing each of the cell voltages one at a time to the high/low threshold using several comparators, the protection circuit can include a comparing network to simultaneously compare the multi-cell voltages to the thresholds by comparing the maximum/minimum cell voltages to the respective high/low threshold. Thus, the manufacturing cost and power consumption are relatively low.

Figure 1:
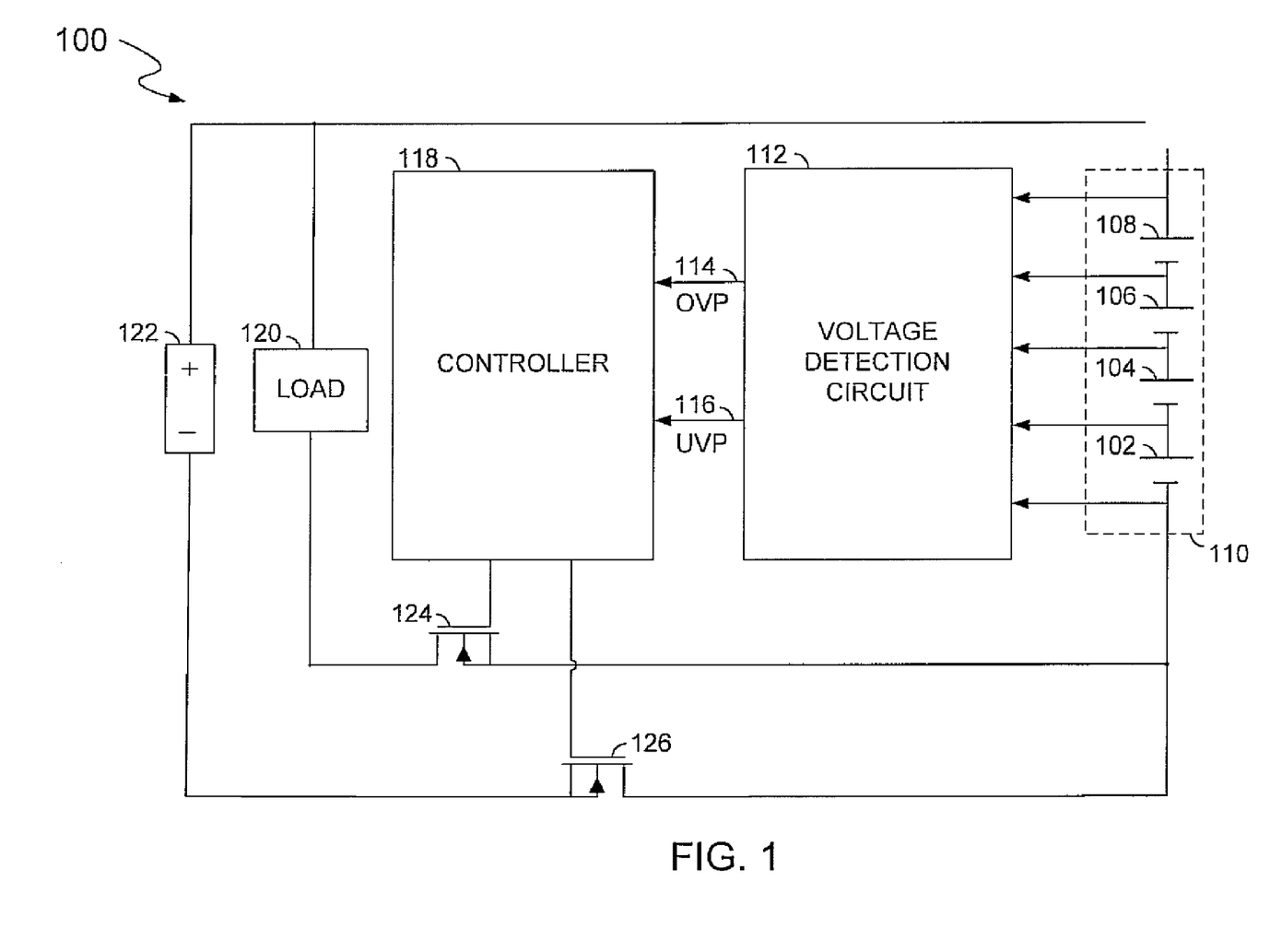
FIG. 1 is a block diagram showing a battery pack protection circuit, in accordance with one embodiment of the present invention.

Referring to FIG. 1, a multi-cell battery pack protection circuit 100 according to one embodiment of the present invention is illustrated. Several rechargeable battery cells, e.g., a first to an $N^{th}$ battery cell, are coupled to each other in series so as to form a multi-cell battery pack 110. In one embodiment, the multi-cell battery pack 110 includes four rechargeable battery cells 102, 104, 106 and 108. A power source 122 is coupled to the battery pack 110 for charging the battery pack 110. The power source 122 may be an AC/DC adapter that converts 220 volts AC input voltage into a DC output voltage. A load 120 is coupled to the battery pack 110 for discharging the battery pack 110.

The battery pack protection circuit 100 is used to prevent over-voltage charging and under-voltage discharging of the battery pack 110. The battery pack protection circuit 100 includes a voltage detection circuit 112, a controller 118, a charging switch, such as a metal oxide semiconductor field effect transistor (MOSFET) 126, and a discharging switch, such as a MOSFET 124. The voltage detection circuit 112 is coupled to the battery cells 102, 104, 106 and 108. The MOSFETs 126 and 124 are coupled to the charging loop and discharging loop, respectively. The controller 118 is coupled to the voltage detection circuit 112 and the two MOSFETs 126 and 124 to control the charging process and the discharging process.

The voltage detection circuit 112 may include a status sensing network and a comparing network. The status sensing network of the voltage detection circuit 112 is used to monitor the cell voltage across each of the battery cells 102-108. During charging, the comparing network of the voltage detection circuit 112 compares the detected cell voltages with a predetermined high-voltage threshold. If the maximum detected cell voltage, e.g., the voltage of the battery 104, exceeds the predetermined high-voltage threshold for a predetermined period of time, then it is determined that at least the battery 104 is experiencing over-voltage. The comparing network of the voltage detection circuit 112 will output an over-voltage protection (OVP) signal 114 as an indication signal.

Figure 2:
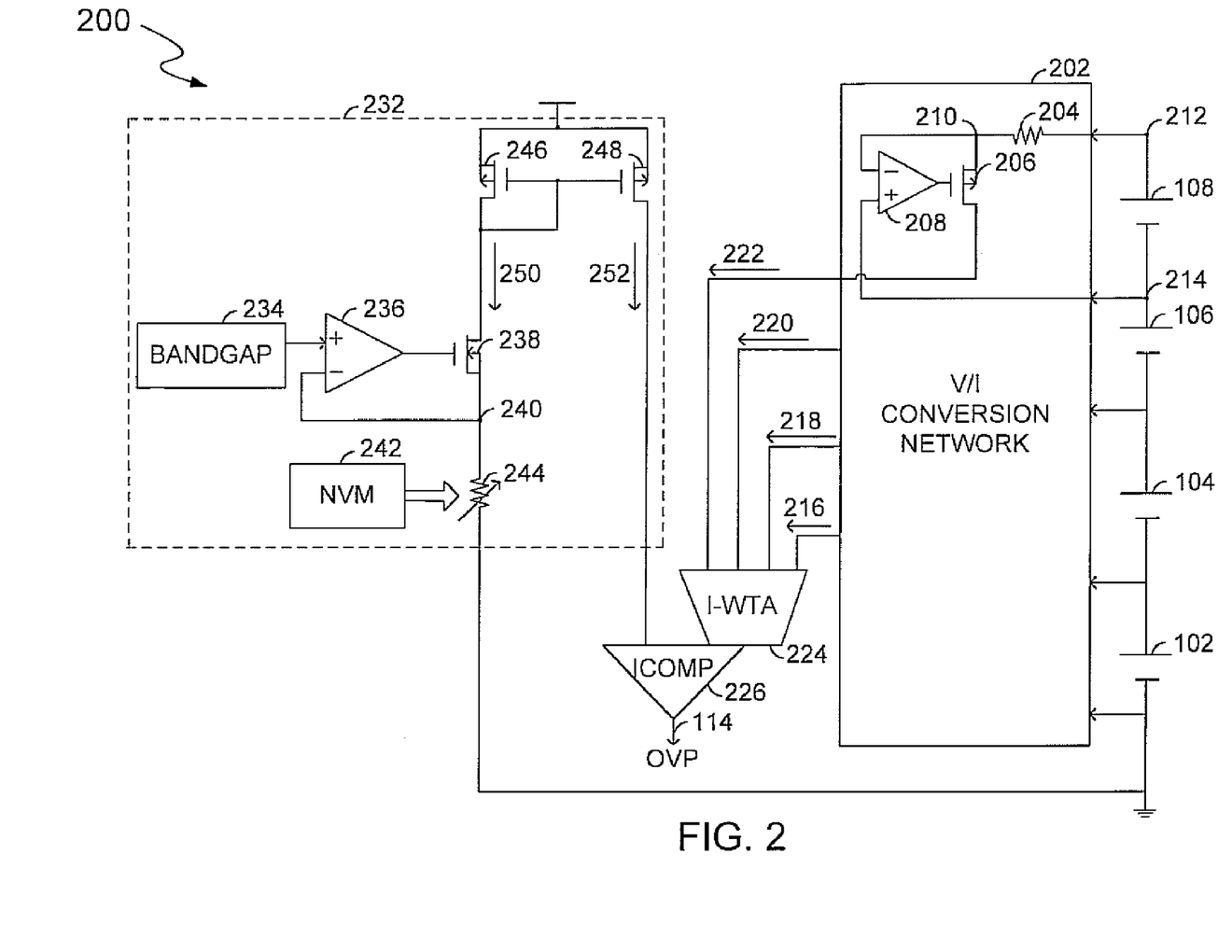
FIG. 2 is a topology diagram showing a current-based voltage detection circuit, in accordance with one embodiment of the present invention.
Figure 3:
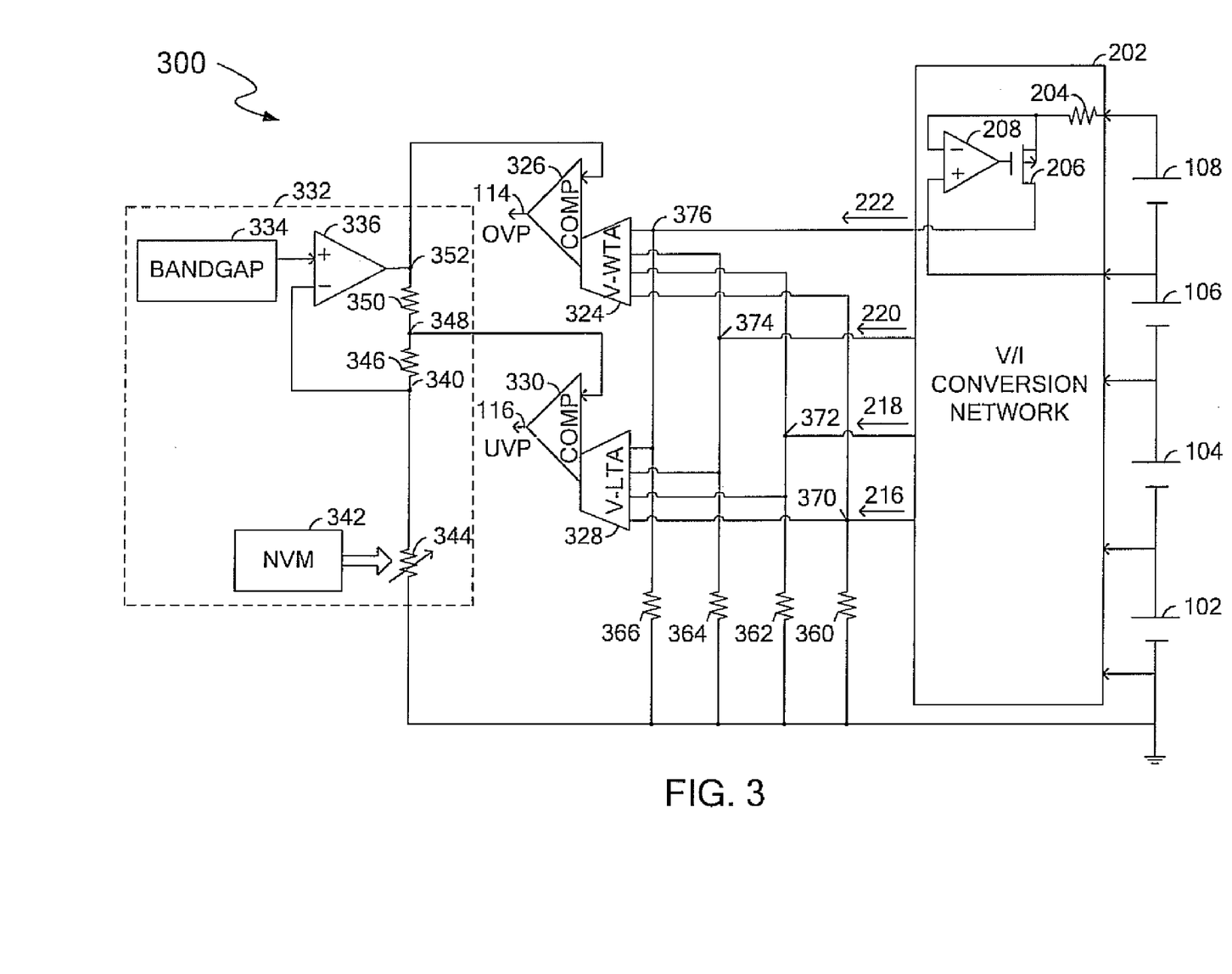
FIG. 3 is a topology diagram showing a voltage-based voltage detection circuit, in accordance with one embodiment of the present invention.

Similarly, during discharging, the comparing network of the voltage detection circuit 112 compares the detected cell voltages with a predetermined low-voltage threshold. If the minimum detected cell voltage, e.g., the voltage of the battery 106, falls below the predetermined low-voltage threshold, the comparing network of the voltage detection circuit 112 will output an under-voltage protection (UVP) signal 116 as an indication signal. The detailed topology of the voltage detection circuit 112 is shown in FIG. 2 and FIG. 3.

In one embodiment, there are several predetermined high/low voltage thresholds that define several different over-voltage/under-voltage levels, and several OVP signals and several UVP signals can be output accordingly. Thus, in one embodiment, the multi-cell battery pack protection circuit 100 has a second predetermined high-voltage threshold for generating a second indication signal, such as a second OVP signal when the maximum of the cell voltages is greater than the second predetermined high-voltage threshold. The multi-cell battery pack protection circuit 100 can also have a second predetermined low-voltage threshold for generating a second indication signal, such as a second UVP signal when the minimum of the cell voltages is lower than the second predetermined low-voltage threshold. For example, during discharging, a UVP signal can be sent out as an alert signal when at least one of the cell voltages drops below a first low-voltage threshold. If the cell voltages keep dropping, a second UVP signal can be sent out to disable the whole discharging loop when the minimum of the cell voltages drops lower than the second low-voltage threshold.

The controller 118 receives the OVP signal 114 and the UVP signal 116. In one embodiment, the controller 118 is a programmable processor executing computer programs. In another embodiment, the controller 118 is a special purpose logic circuit, such as a field programmable gate array (FPGA) or an application-specific integrated circuit (ASIC). In response to the active OVP signal 114, the controller 118 can initiate an action to disable the charging loop. In response to the active UVP signal 116, the controller 118 can disable the discharging loop. As such, damage to the battery pack 110 caused by over-voltage charging and under-voltage discharging is prevented.

In one embodiment, the MOSFETs 126 and 124 are implemented as n-channel MOSFETs. For example, in response to the active OVP signal 114, the controller 118 may output a voltage on the gate of the charging MOSFET 126. The output voltage should be lower than the voltage on the source of the charging MOSFET 126 plus a threshold voltage. Then the charging MOSFET 126 is turned off and power delivery from the power source 122 to the battery pack 110 is halted. Whenever the sensed maximum cell voltage returns below the high-voltage threshold, the controller 118 may turn on the charging MOSFET 126 for continued charging.

Likewise, the discharging MOSFET 124 can be turned off by the controller 118 to prevent further discharging. Whenever the sensed minimum cell voltage returns above the low-voltage threshold, the controller 118 will turn on the discharging MOSFET 124 to continue discharging. Alternatively, in other embodiments, the MOSFETs 126 and 124 are other types of electronic components, such as p-channel MOSFETs or bipolar junction transistors.

Referring to FIG. 2, a current-based over-voltage detection circuit 200, which is one embodiment of the voltage detection circuit 112 shown in FIG. 1, is illustrated. In one embodiment, the current-based over-voltage detection circuit 200 is implemented on a single integrated circuit (IC). In the FIG. 2 embodiment, the current-based over-voltage detection circuit 200 includes a current reference block 232, a status sensing network, e.g., a voltage to current (V/I) conversion network 202, and a comparing network, e.g., a current winner-take-all (I-WTA) network 224.

The V/I conversion network 202 is coupled to the battery cells 102-108 to convert individual cell voltages into currents. The V/I conversion network 202 includes four operational amplifiers, four MOSFETs, and four resistors corresponding to the four battery cells 102-108. For brevity and clarity, only an operational amplifier 208, a p-channel MOSFET 206 and a resistor 204 corresponding to the battery cell 108 are shown in FIG. 2. Similar components corresponding to the battery cells 102-106 are not shown and not described repeatedly.

The operational amplifier 208 has a noninverting input terminal, an inverting input terminal, and an output terminal. The two input terminals are coupled to the battery cell 108. The output terminal is fed back to the inverting input terminal through the MOSFET 206 whose gate is coupled to the output terminal and whose source is coupled to the inverting input terminal. The resistor 204 is coupled between node 210 and the battery cell 108.

It is assumed that the operational amplifier 208 is an ideal operational amplifier. Because the operational amplifier 208 generates a deep negative feedback, the operational amplifier 208 can be considered as virtual short and virtual open. Voltage at the node 210 is substantially equal to voltage at node 214, and voltage across the resistor 204 is substantially equal to the cell voltage of the battery cell 108. The drain of the MOSFET 206 outputs a current 222 whose value is substantially equal to the cell voltage of the battery cell 108 divided by the resistance of the resistor 204.

As such, three other currents 216, 218 and 220 corresponding to the battery cells 102, 104 and 106 can be generated. Since the four operational amplifiers, four MOSFETs, and four resistors in the V/I conversion network 202 are practically identical to each other, the converted currents 216-222 are just proportional to the cell voltages of corresponding battery cells. Therefore, the highest cell voltage will cause the largest converted current. The four converted currents 216-222 are input to the I-WTA network 224.

The current reference block 232 is used to generate a predetermined high-current reference 252. The current reference block 232 includes a trimmed bandgap voltage reference 234, an operational amplifier 236, an n-channel MOSFET 238, a non-volatile memory (NVM) 242, an adjustable resistor 244, and a pair of p-channel MOSFETs 246 and 248. The bandgap voltage reference 234 is a relatively stable voltage reference which employs a trimming technique to achieve a low temperature coefficient and high initial accuracy. The bandgap voltage reference 234 is input to the operational amplifier 236.

Because the operational amplifier 236 and the MOSFET 238 generate a deep negative feedback, the voltage at node 240 is equal to the voltage of the bandgap voltage reference 234. Consequently, it seems as if no current flows through the operational amplifier 236. A current 250 is generated by the MOSFET 238. The current 250 is substantially equal to the voltage of the bandgap voltage reference 234 divided by the resistance of the adjustable resistor 244. Therefore, the current 250 can be trimmed by adjusting the resistor 244.

The two p-channel MOSFETs 246 and 248 are disposed symmetrically so as to form a current mirror. Because the MOSFETs 246 and 248 have the same gate-source voltages, the MOSFET 248 generates the predetermined high-current reference 252 identical to the current 250. As such, the predetermined high-current reference 252 is generated by the current reference block 232 and is input to the I-WTA network 224 as a comparison threshold.

The I-WTA network 224 includes a current comparator 226 for simultaneously comparing the currents 216-222 with the predetermined high-current reference 252. If the maximum of the currents 216-222 is larger than the predetermined high-current reference 252, then the I-WTA network 224 outputs an active over-voltage protection (OVP) signal 114 indicating an over-voltage state. For example, the output OVP signal 114 may transition to logic HIGH to indicate the over-voltage state. The OVP signal 114 can be transferred to a controller, such as the controller 118 shown in FIG. 1. In response to the OVP signal 114 which indicates the over-voltage state, the controller may stop charging and/or an alert signal may be issued, depending on the degree of the over-voltage state and on whether one over-voltage threshold or two over-voltage thresholds are used, as previously described herein.

Similarly, in another embodiment, the comparing network can include a current loser-take-all (I-LTA) network. The I-LTA network can include a current comparator for simultaneously comparing the currents 216-222 with a predetermined low-current reference. If the minimum of the currents 216-222 is lower than the predetermined low-current reference, the I-LTA network can output an active under-voltage protection (UVP) signal indicating an under-voltage state.

Referring to FIG. 3, a voltage-based over-voltage and under-voltage detection circuit 300 according to one embodiment of the present invention, which is another embodiment of the voltage detection circuit 112 shown in FIG. 1, is illustrated. The voltage-based over-voltage and under-voltage detection circuit 300 is a modification of the current-based over-voltage detection circuit 200 shown in FIG. 2. Elements labeled the same as in FIG. 2 have similar functions and will not be described hereinafter in detail. The circuit 300 not only can detect over-voltage while charging, but also under-voltage while discharging. In one embodiment, the voltage based over-voltage and under-voltage detection circuit 300 is implemented on a single IC.

The voltage-based over-voltage and under-voltage detection circuit 300 includes a voltage reference block 332, a status sensing network, e.g., a voltage to current (V/I) conversion network 202, and a comparing network, e.g., a voltage winner-take-all (V-WTA) network 324 and a voltage loser-take-all (V-LTA) network 328.

The V/I conversion network 202 converts the cell voltages of the battery cells 102, 104, 106 and 108 into currents 216, 218, 220 and 222. The converted currents 216-222 are reconverted into ground-based voltages by means of four pull-down resistors 360, 362, 364 and 366. As shown, voltages at nodes 370, 372, 374 and 376 are substantially equal to cell voltages across the battery cells 102-108 respectively. The ground-based voltages at the nodes 370-376 are input to the V-WTA network 324 and the V-LTA network 328 for further comparison.

The voltage reference block 332 is used to generate two comparison thresholds: a high-voltage threshold and a low-voltage threshold. The voltage reference block 332 includes a bandgap voltage reference 334, an operational amplifier 336, and three resistors 344, 346 and 350.

The operational amplifier 336 generates a negative feedback. Assuming the operational amplifier 336 is an ideal one, then voltage at node 340 is substantially equal to the voltage of the bandgap voltage reference 334. Current flowing through the three resistors 344, 346 and 350 is substantially equal to the voltage of the bandgap voltage reference 334 divided by the resistance of the resistor 344. The NVM 342 is used for adjusting the resistance of the resistor 344. By choosing proper resistors 346 and 350, the low-voltage threshold is generated at node 348 and the high-voltage threshold is generated at node 352. The low-voltage threshold and high-voltage threshold are input to the V-LTA network 328 and the V-WTA network 324, respectively.

The V-WTA network 324 and the V-LTA network 328 are similar to the I-WTA network 224 of the current-based over-voltage detection circuit 200 shown in FIG. 2. The V-WTA network 324 includes an over-voltage voltage comparator 326 for comparing voltages at nodes 360-366 with the predetermined high-voltage threshold. The voltages at nodes 360-366 indicate the cell voltages of the battery cell 102-108. If the maximum cell voltage is larger than the predetermined high-voltage threshold, then the V-WTA network 324 will output an OVP signal 114 indicating the over-voltage state. For example, the output OVP signal 114 may go logic HIGH.

Similarly, the V-LTA network 328 includes an under-voltage voltage comparator 330 for comparing the reconverted cell voltages of the battery cell 102-108 with the predetermined low-voltage threshold. If the lowest cell voltage is lower than the predetermined low-voltage threshold, the V-LTA network 328 will output an UVP signal 116 indicating the under-voltage state.

Both the OVP signal 114 and the UVP signal 116 are transferred to a controller, such as the controller 118 shown in FIG. 1. The controller can take actions to stop further charging or discharging so as to prevent damage to the battery pack. The V-WTA network 324 and the V-LTA network 328 are described in detail with reference to FIG. 4 and FIG. 5, respectively.

Figure 4:
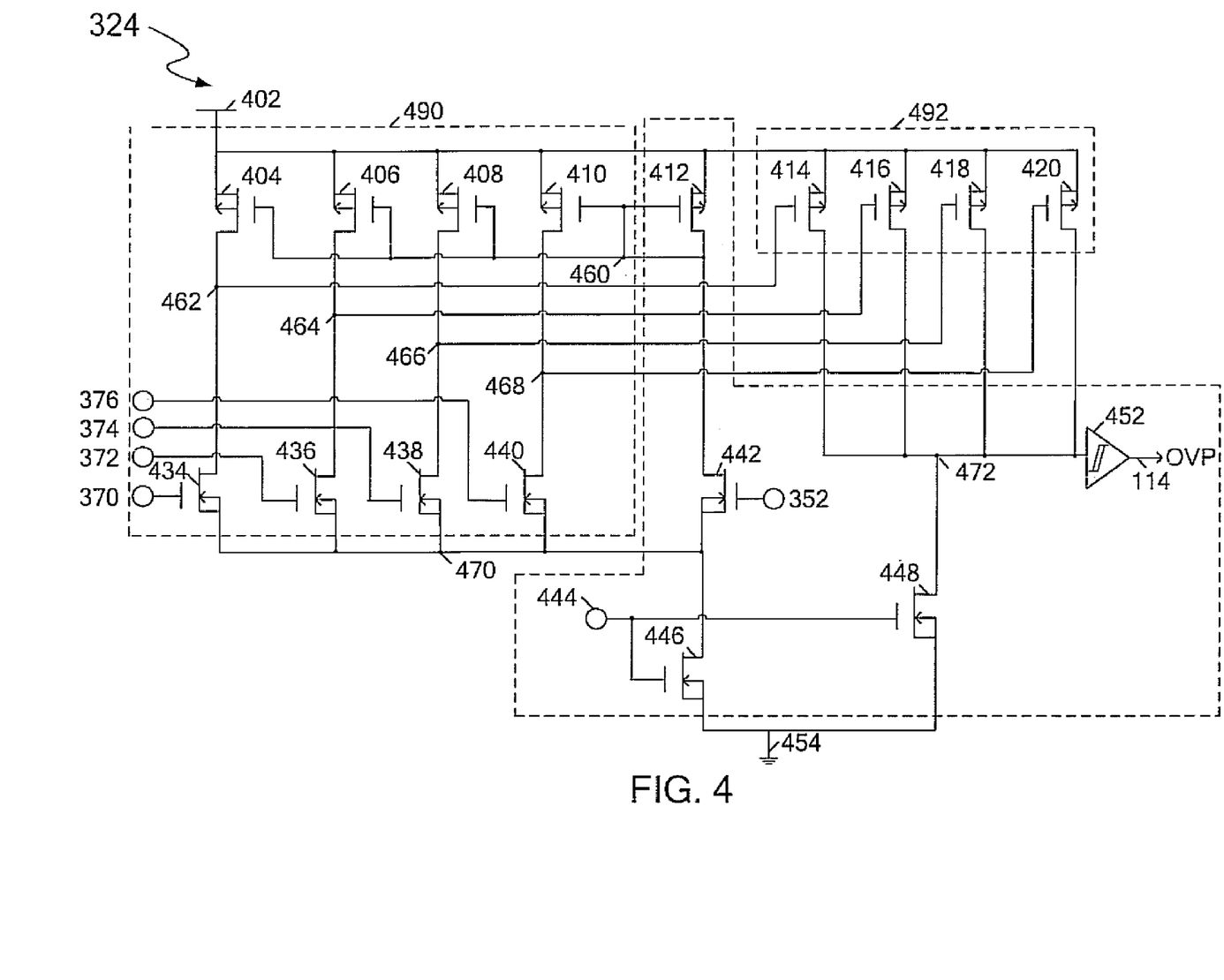
FIG. 4 is a topology diagram showing the V-WTA network of the voltage detection circuit shown in FIG. 3, in accordance with one embodiment of the present invention.

Referring to FIG. 4, the V-WTA network 324 of the comparing network shown in FIG. 3 according to one embodiment of the present invention is illustrated in detail. The V-WTA network 324 includes a first-gain stage 490, a second gain stage 492, a threshold transistor, such as an n-channel MOSFET 442, a threshold load transistor, such as a p-channel MOSFET 412 and a Schmitt trigger 452. In one embodiment, the first-gain stage 490 includes N first-gain transistors from a first first-gain transistor to an $N^{th}$ first-gain transistor, such as n-channel MOSFETs 434-440. The first-gain stage 490 further includes N load transistors from a first load transistor to an $N^{th}$ load transistor, such as p-channel MOSFETs 404-410. In one embodiment, the N load transistors serve as loads of the N first-gain transistors. The N cell voltages, such as the cell voltages of the battery cells 102, 104, 106 and 108 at nodes 370, 372, 374 and 376 in FIG. 3, are input into the first-gain stage 490, each cell voltage received by one of the N first-gain transistors. The predetermined high-voltage threshold is input into the threshold transistor. The second-gain stage 492 includes N second-gain transistors from a first second-gain transistor to an $N^{th}$ second-gain transistor, such as p-channel OVP MOSFETs 414-420, and a second-gain load transistor, such as a n-channel MOSFET 448. In one embodiment, the second gain load transistor serves as loads of the N second-gain transistors.

When one of the N cell voltages, e.g., a $K^{th}$ cell voltage which is the maximum of the N cell voltages (where k=1, 2, . . . N), exceeds the high-voltage threshold, the $K^{th}$ first-gain transistor in the first-gain stage 490 can be actuated to amplify a voltage difference between the high-voltage threshold input into the threshold transistor, e.g., the n-channel MOSFET 442 and the $K^{th}$ cell voltage input into the $K^{th}$ first-gain transistor. The $K^{th}$ second-gain transistor in the second-gain stage 492 corresponding to the $K^{th}$ first-gain transistor can also be actuated to further amplify the voltage difference and to generate a first logic voltage, such as logic HIGH, at the node 472. The Schmitt trigger 452 is coupled to the node 472 to smooth voltage dither of the first logic voltage at the node 472 and to finally output the OVP signal 114.

When none of the N cell voltages exceeds the high-voltage threshold, the n-channel MOSFET 442 and the p-channel MOSFET 412 are actuated. At the same time, none of the N second-stage transistors in the second gain stage 492 is actuated. Therefore, a second logic voltage, such as a logic LOW, is generated at the node 472.

In one example, the first-gain stage 490 includes four n-channel MOSFETs 434, 436, 438 and 440 and four p-channel MOSFETs 404, 406, 408 and 410. The second-gain stage 492 includes four p-channel OVP MOSFETs 414, 416, 418 and 420.

Continuing with reference to FIG. 4, in one embodiment, nodes 370, 372, 374 and 376 are coupled to the gates of four n-channel MOSFETs 434, 436, 438 and 440, respectively, and node 352 is coupled to the gate of a n-channel MOSFET 442. The five n-channel MOSFETs 434-442 have the same dimensions and share the same source voltage at node 470. Five p-channel MOSFETs 404, 406, 408, 410, and 412 have the same dimensions. The MOSFETs 404-410 share the same source voltage of the power supply voltage 402 and the same gate voltage at node 460. The drains of the MOSFETs 404-410 are coupled to the drains of the MOSFETS 434-442, respectively. The drain of the MOSFET 412 is also coupled to the node 460.

The four p-channel OVP MOSFETs 414, 416, 418, and 420 have the same dimensions. They share the same source voltage of the power supply voltage 402 and the same drain voltage at node 472. Their gates are coupled to the drains of the MOSFETs 434 and 404, 436 and 406, 438 and 408, and 440 and 410, respectively. Two n-channel MOSFETs 446 and 448 have the same dimensions and share the same source voltage at the ground 454 and the same gate-source voltage at a bias voltage terminal 444. The drains of the MOSFETs 446 and 448 are coupled to the nodes 470 and 472 respectively.

The MOSFETs 446 and 448 serve as current sources for the first gain stage 490 and the second gain stage 492 of the whole V-WTA network 324. Control terminal 444 can be used to adjust the current value flowing through the MOSFETs 446 and 448. In one embodiment, the power supply voltage 402 indicates logic HIGH, whereas the ground voltage 454 indicates logic LOW. Accordingly, node 470 will be coupled to the ground 454 and turned to logic LOW. Since the MOSFETs 434, 436, 438, 440 and 442 are identical to each other; the one that receives the largest gate-source voltage will be actuated first.

For example, if the voltage at the node 352 is larger than the voltage at any of the cells 102-108 (at the nodes 370-376), which indicates none of the cell voltages exceeds the predetermined high-voltage threshold, then the MOSFET 442 is actuated and all current from the MOSFET 446 flows through the MOSFET 442 to the MOSFET 412. The p-channel MOSFETs 404, 406, 408 and 410 can mirror the current from the MOSFET 412 since they share the same gate-source voltage. However, there is no current flowing through the n-channel MOSFETs 434, 436, 438 and 440 and this can pull the nodes 462, 464, 466 and 468 to logic HIGH to turn off the p-channel MOSFETs 414, 416, 418 and 420 since their gate-source voltage become smaller. Then the node 472 will be pulled low by the MOSFET 448. The Schmitt trigger 452 is coupled to the node 472 for smoothing voltage dither at the node 472 and finally outputting the OVP signal 114. The OVP signal 114 will be logic LOW.

Alternatively, under the condition that one cell voltage goes higher than the predetermined high-voltage threshold, the OVP signal 114 will turn to logic HIGH. For example, if the voltage at the node 372 is the highest of all the nodes 370-376 and exceeds the voltage at the node 352, then the MOSFET 436 is actuated. Node 464 will turn to logic LOW and the OVP MOSFET 416 will be actuated. As the OVP MOSFET 416 is turned on, the node 472 will turn to logic HIGH. As such, the OVP signal 114 will be logic HIGH.

Figure 5:
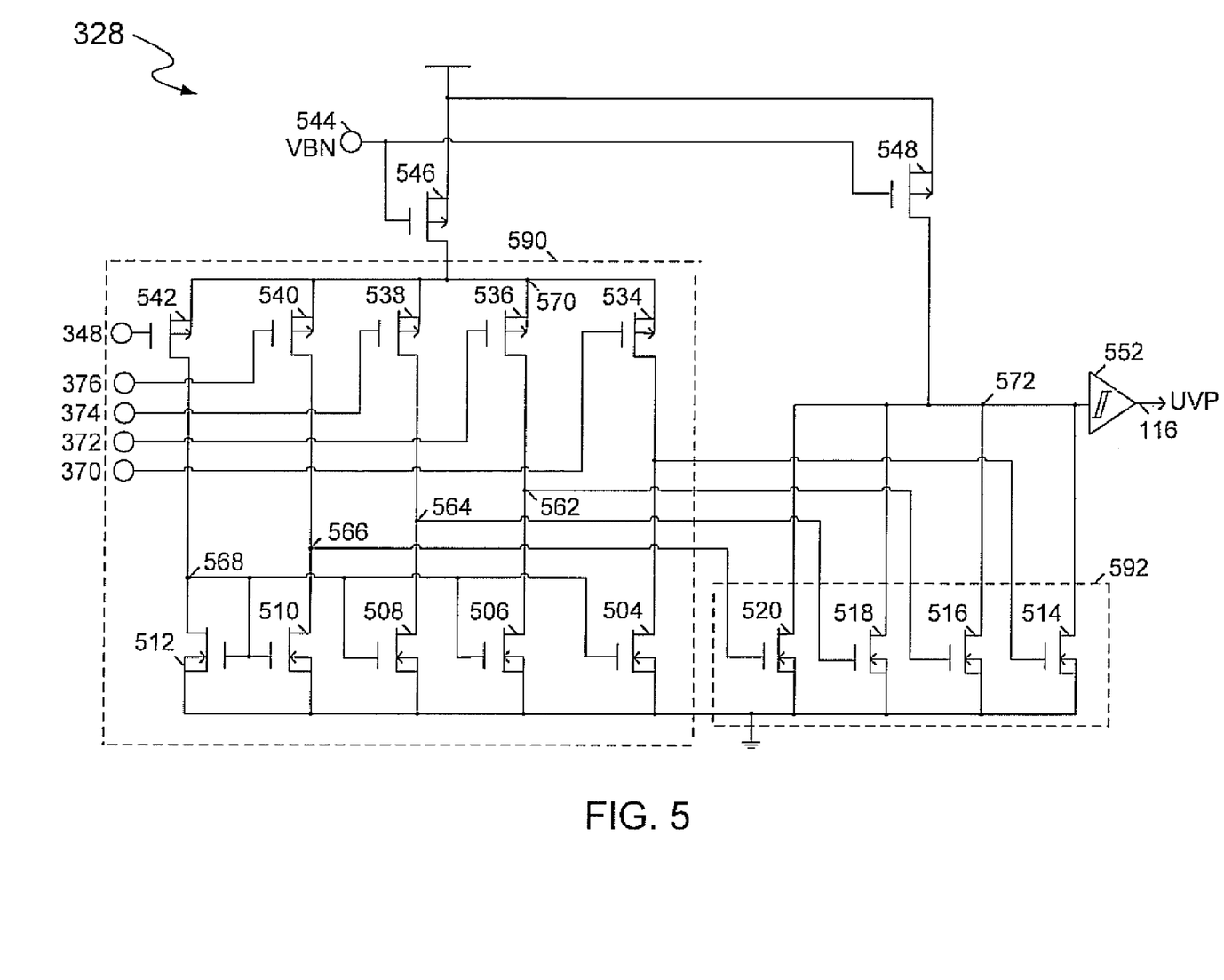
FIG. 5 is a topology diagram showing the V-LTA network of the voltage detection circuit shown in FIG. 3, in accordance with one embodiment of the present invention.

Referring to FIG. 5, the V-LTA network 328 of the comparing network shown in FIG. 3 according to one embodiment of the present invention is illustrated. The V-LTA network 328 is similar to the V-WTA network 324 shown in FIG. 4. Elements labeled the same as in FIG. 4 have similar functions and will not be described hereinafter in detail. The V-LTA network 324 includes a first-gain stage 590, a second gain stage 592, a threshold transistor, such as a p-channel MOSFET 542, a threshold load transistor, such as an n-channel MOSFET 512, and a Schmitt trigger 552. The n-channel MOSFETs of the V-WTA network 324 are replaced by p-channel MOSFETs and vice versa. P-channel MOSFETs 546 and 548 serve as a current source for the whole V-LTA network 328. A bias voltage terminal 544 is coupled to the gates of the two MOSFETs 546 and 548 to adjust the current flowing through the MOSFETs 546 and 548. On receiving logic LOW at the VBN terminal 544, the V-LTA network 328 starts to work.

If none of the voltages at nodes 370, 372, 374 and 376 drops below the predetermined low-voltage threshold at node 348, the MOSFET 542 is turned on. Then, MOSFETs 512, 510, 508, 506 and 504 are actuated to pull nodes 562, 564, 564 and 568 to logic LOW, and UVP MOSFETs 520, 518, 516 and 514 are cut off. Node 572 will be pulled high by the current source 548 and the UVP signal 116 will be logic HIGH. If one cell voltage, e.g., the voltage at the node 374, becomes lower than the predetermined low-voltage threshold at the node 348, MOSFETs 538 and 518 are actuated. Current will flow through the MOSFETs 548 and 518. Since the node 572 is coupled to the ground, the UVP signal 116 will be logic LOW.

There is only one active branch in either in the V-WTA network 324 or in the V-LTA network 328. As such, the power consumption of the V-WTA network 324 and the V-LTA network 328 is relatively low.

More advanced Li-Ion battery packs may have gas gauge ICs for estimating the remaining capacity of the battery pack. In such advanced battery packs, the low cost battery protection circuit described hereinabove can be used as a secondary protection measure.

Figure 6:
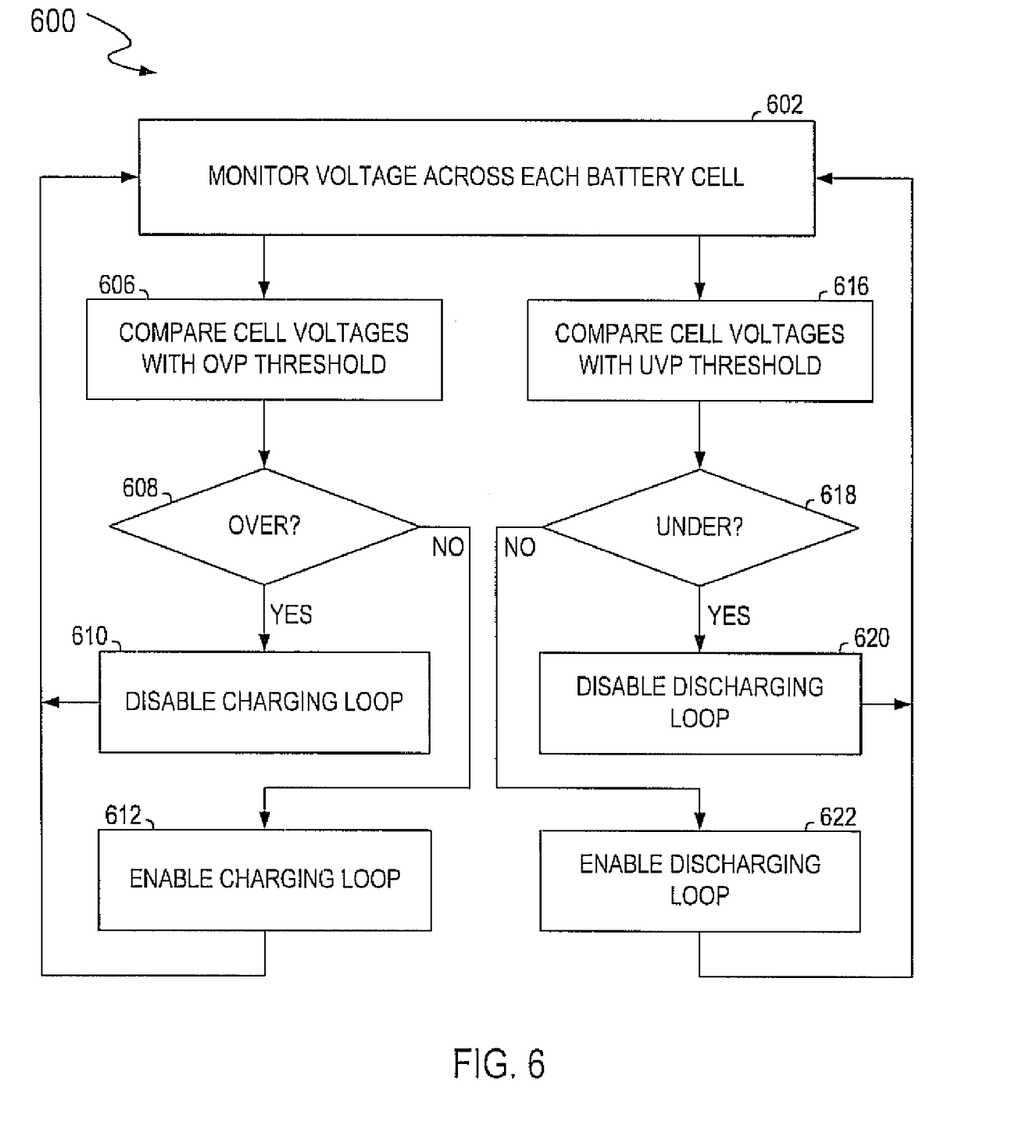
FIG. 6 is a flowchart showing examples of operations performed by a battery pack protection circuit, in accordance with one embodiment of the present invention.

Referring to FIG. 6, a flowchart showing an operation process 600 performed by a battery pack protection circuit for protecting a battery pack from over voltage charging and under voltage discharging, in accordance with one embodiment of the present invention, is illustrated. A plurality of battery cells are coupled in series so as to form the battery pack. The battery pack can be coupled to the battery pack protection circuit. The flowchart is initiated in block 602, based on an initial condition that none of the battery cells are damaged.

In block 602, voltages across the battery cells are individually monitored. In one embodiment, a V/I conversion network can be employed. By means of a corresponding operational amplifier and a MOSFET, voltage across a certain battery cell is converted to a current. For comparison convenience, the current can be reconverted into a ground-based voltage. All reconverted ground-based voltages are monitored. Consequently, the flowchart is illustrated in line with two aspects: block 606 to block 612 are performed during charging, and block 616 to block 622 are performed during discharging.

In block 606, the monitored cell voltages are compared with a high-voltage threshold or over-voltage protection (OVP) threshold. In one embodiment, the comparison is done by a voltage winner-take-all (V-WTA) network. In block 608, if the maximum cell voltage exceeds the OVP threshold for a predetermined period of time, the flowchart goes to block 610. Otherwise the flowchart goes to block 612. In block 610, an active OVP signal is generated for indicating over-voltage charging; in one embodiment, the charging process is consequently disabled. In response to the active OVP signal, a controller can be used to open a charging MOSFET so as to disable the charging loop. After the block 610, the flowchart turns to the block 602. The cell voltages will be still monitored and a new cycle will begin. In the block 612, the charging loop is enabled and the charging process is continued. The controller can initiate recharging of the battery pack by turning on the charging MOSFET.

Referring to the discharging aspect, returning back to block 616, the cell voltages are compared with a low-voltage threshold or under-voltage protection (UVP) threshold. In one embodiment, a voltage loser-take-all (V-LTA) network 328 shown in FIG. 3 and FIG. 5 is utilized. The reconverted ground-based cell voltages are input to the V-LTA network 328. The lowest input voltage will enable a corresponding MOSFET.

In block 618, if the minimum cell voltage is below the UVP threshold, the flowchart goes to block 620. In block 620, a controller may disable the discharging loop to prevent damage caused by further discharging. An UVP signal representing an under-voltage discharging state is outputted. For example, the V-LTA network 328 can output logic LOW. In response to the logic LOW UVP signal, the controller may initiate an action to disable the discharging loop, such as turning off a discharging MOSFET.

Alternatively, if none of the monitored cell voltages is below the UVP threshold, the flowchart goes to block 622. In the block 622, the discharging process continues. In one embodiment, logic HIGH, representing that all the battery cells are safe, may be output in the V-LTA network 328. The controller can turn on the discharging MOSFET until the logic LOW UVP signal is received.

As an alternative to disabling the charging loop or the discharging loop as just described, an alert signal may be issued if a threshold is crossed. Also, as previously described herein, more than one threshold may be utilized—if a lower threshold is crossed, then an alert signal may be sent, and if a higher threshold is crossed, then the charging or discharging loop may be disabled.

Accordingly, in one embodiment, the voltage detection circuit 300 of a battery pack protection circuit uses a plurality of MOSFETs to form a V-WTA network and a V-LTA network so as to simultaneously monitor cell voltages of a multi-cell battery pack. When the maximum cell voltage is higher than a predetermined high-voltage threshold, the V-WTA network can output a signal indicating that at least one battery cell is in an over-voltage state. When the minimum cell voltage is lower than a predetermined low-voltage threshold, the V-LTA network can output a signal indicating that at least one battery cell is in an under-voltage state. In operation, only one pair of MOSFETs is turned on, such that the power consumption of the voltage detection circuit can be saved.

While the foregoing description and drawings represent the embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A voltage detection circuit for low power consumption monitoring of a rechargeable multi-cell battery pack, comprising:

a status sensing network configured to detect a plurality of cell voltages, each of said cell voltages corresponding to an individual battery cell of a plurality of battery cells comprising a first to an $N^{th}$ battery cell; and a comparing network coupled to said status sensing network and configured to simultaneously compare said cell voltages with at least one predetermined voltage threshold using a plurality of indicative signals and a predetermined comparison threshold, and further configured to generate an indication signal if an extremum of said cell voltages crosses said predetermined voltage threshold, wherein said indicative signals are indicative of said cell voltages respectively, wherein said predetermined comparison threshold corresponds to said predetermined voltage threshold, and wherein said comparing network comprises:

a threshold transistor that receives said predetermined comparison threshold;

a first-gain stage coupled to said threshold transistor and comprising N first-gain transistors that receive said indicative signals, said first-gain stage configured to actuate a $K^{th}$ first-gain transistor of said N first-gain transistors to indicate a difference between said predetermined comparison threshold and a $K^{th}$ indicative signal that is an extremum of said indicative signals and is received by said $K^{th}$ first-gain transistor, wherein said $K^{th}$ first-gain transistor is actuated if said $K^{th}$ indicative signal crosses said predetermined comparison threshold; and a second-gain stage coupled to said first-gain stage and configured to generate said indication signal based on said difference if said $K^{th}$ indicative signal crosses said predetermined comparison threshold, where $K=1, 2, \ldots, N$.

2. The voltage detection circuit as claimed in claim 1, wherein said indicative signals are generated at least in part by converting said cell voltages to a plurality of cell currents via a voltage to current (V/I) conversion network.

3. The voltage detection circuit as claimed in claim 2, wherein said predetermined comparison threshold comprises a predetermined current threshold, wherein said indicative signals comprise said cell currents, and wherein said comparing network is operable for simultaneously comparing said cell currents with said predetermined current threshold and further operable for generating said indication signal if an extremum of said cell currents crosses said predetermined current threshold.

4. The voltage detection circuit as claimed in claim 2, wherein said indicative signals are further generated by converting said cell currents to a plurality of indicative voltages via a plurality of resistors coupled to said V/I conversion network.

5. The voltage detection circuit as claimed in claim 1, wherein said threshold transistor receives a predetermined high-voltage threshold, wherein said first-gain stage comprising said N first-gain transistors receives a plurality of indicative voltages indicative of said cell voltages, wherein said first-gain stage actuates said $K^{th}$ first-gain transistor to indicate a voltage difference between said predetermined high-voltage threshold and a $K^{th}$ indicative voltage if said $K^{th}$ indicative voltage is greater than said predetermined high-voltage threshold, and wherein said $K^{th}$ indicative voltage is the maximum indicative voltage of said indicative voltages and received by said $K^{th}$ first-gain transistor.

6. The voltage detection circuit as claimed in claim 5, wherein said second-gain stage comprises N second-gain transistors, and wherein said second-gain stage actuates a $K^{th}$ second-gain transistor corresponding to said $K^{th}$ first-gain transistor to further indicate said voltage difference and generates said indication signal if said $K^{th}$ indicative voltage is greater than said predetermined high-voltage threshold.

7. The voltage detection circuit as claimed in claim 1, wherein said threshold transistor receives a predetermined low-voltage threshold, wherein said first-gain stage comprising said N first-gain transistors receives a plurality of indicative voltages indicative of said cell voltages, wherein said first-gain stage actuates said $K^{th}$ first-gain transistor to indicate a voltage difference between said predetermined low-voltage threshold and a $K^{th}$ indicative voltage if said $K^{th}$ indicative voltage is less than said predetermined low-voltage threshold, and wherein said $K^{th}$ indicative voltage is the minimum indicative voltage of said indicative voltages and received by said $K^{th}$ first-gain transistor.

8. The voltage detection circuit as claimed in claim 7, wherein said second-gain stage comprises N second-gain transistors, and wherein said second-gain stage actuates a $K^{th}$ second-gain transistor corresponding to said $K^{th}$ first-gain transistor to further indicate said voltage difference and generates said indication signal if said $K^{th}$ indicative voltage is less than said predetermined low-voltage threshold.

9. The voltage detection circuit as claimed in claim 1, wherein said comparing network compares said cell voltages with a first high-voltage threshold and a second high-voltage threshold, generates a first indication signal indicating a first level of over-voltage of said battery pack if the maximum cell voltage of said cell voltages is greater than said first high-voltage threshold, and generates a second indication signal indicating a second level of over-voltage of said battery pack if said maximum cell voltage is greater than said second high-voltage threshold.

10. The voltage detection circuit as claimed in claim 1, wherein said comparing network compares said cell voltages with a first low-voltage threshold and a second low-voltage threshold, generates a first indication signal indicating a first level of under-voltage of said battery pack if the minimum cell voltage of said cell voltages is less than said first low-voltage threshold, and generates a second indication signal indicating a second level of under-voltage of said battery pack if said minimum cell voltage is less than said second low-voltage threshold.

11. A method for low power consumption monitoring and protecting of a rechargeable multi-cell battery pack that comprises a plurality of battery cells comprising a first to an $N^{th}$ battery cell, said method comprising:

sensing a plurality of cell voltages corresponding to said battery cells via a status sensing network;

generating a plurality of indicative signals at least in part via said status sensing network, wherein said indicative signals are indicative of said cell voltages;

receiving a predetermined comparison threshold via a threshold transistor in a comparing network that is coupled to said status sensing network;

receiving said indicative signals via N first-gain transistors in said comparing network;

actuating a $K^{th}$ first-gain transistor to indicate a difference between said predetermined comparison threshold and a $K^{th}$ indicative signal that is an extremum of said indicative signals and is received by said $K^{th}$ first-gain transistor if said $K^{th}$ indicative signal crosses said predetermined comparison threshold, via said comparing network; and generating a protection signal if said $K^{th}$ indicative signal crosses said predetermined comparison threshold via said comparing network.

12. The method as claimed in claim 11, wherein said generating said indicative signals comprises converting said cell voltages to a plurality of cell currents, wherein said indicative signals comprise said cell currents, and wherein said predetermined comparison threshold comprises a predetermined current threshold.

13. The method as claimed in claim 11, wherein said generating said indicative signals comprises converting said cell voltages to a plurality of cell currents, and converting said cell currents to a plurality of indicative voltages via a plurality of resistors, wherein said indicative signals comprise said indicative voltages, and wherein said predetermined comparison threshold comprises a predetermined voltage threshold.

14. A multi-cell battery pack protection circuit for low power consumption monitoring and protecting of a rechargeable multi-cell battery pack, comprising:

a plurality of battery cells comprising a first to an $N^{th}$ battery cell coupled in series with each other;

a voltage detection circuit coupled to said plurality of battery cells and operable for detecting a plurality of cell voltages each corresponding to an individual battery cell of said battery cells, simultaneously comparing said cell voltages with a predetermined high-voltage threshold, and generating an over-voltage protection signal if a maximum cell voltage of said cell voltages is greater than said predetermined high-voltage threshold, wherein said voltage detection circuit comprises:

a first transistor operable for receiving said predetermined high-voltage threshold;

a first-gain stage coupled to said first transistor and comprising N first-gain transistors operable for receiving a plurality of indicative voltages indicative of said cell voltages, and said first-gain stage operable for actuating a $K^{th}$ first-gain transistor of said N first-gain transistors to indicate a first voltage difference between said predetermined high-voltage threshold and a $K^{th}$ indicative voltage that is the maximum indicative voltage of said indicative voltages and is received by said $K^{th}$ first-gain transistor, wherein said $K^{th}$ first-gain transistor is actuated if said $K^{th}$ indicative voltage is greater than said predetermined high-voltage threshold; and a second-gain stage coupled to said first-gain stage and operable for generating said over-voltage protection signal based on said first voltage difference if said $K^{th}$ indicative voltage is greater said predetermined high-voltage threshold, where K=1, 2, ..., N;

a charging switch coupled to said battery cells and operable for controlling charging of said battery cells; and a controller coupled to said voltage detection circuit and said charging switch and operable for disabling said charging switch based on said over-voltage protection signal.

15. The multi-cell battery pack protection circuit as claimed in claim 14, wherein said second-gain stage comprises: N second-gain transistors operable for actuating a $K^{th}$ second-gain transistor corresponding to said $K^{th}$ first-gain transistor to further indicate said first voltage difference and further operable for generating said over-voltage protection signal if said $K^{th}$ indicative voltage is greater than said predetermined high-voltage threshold.

16. The multi-cell battery pack protection circuit as claimed in claim 14, wherein said voltage detection circuit further simultaneously compares said cell voltages with a predetermined low-voltage threshold and generates an under-voltage protection signal to said controller if a minimum cell voltage of said cell voltages is less than said predetermined low-voltage threshold.

17. The multi-cell battery pack protection circuit as claimed in claim 16, wherein said voltage detection circuit further comprises:

a second transistor that receives said predetermined low-voltage threshold;

a third-gain stage coupled to said second transistor and comprising N third-gain transistors that receive said indicative voltages indicative of said cell voltages, and said third-gain stage operable for actuating a third-gain transistor of said N third-gain transistors to indicate a second voltage difference between said predetermined low-voltage threshold and a minimum indicative voltage of said indicative voltages, wherein said minimum indicative voltage is received by said third-gain transistor of said N third-gain transistors, and wherein said third-gain transistor of N third-gain transistors is actuated if said minimum indicative voltage is less than said predetermined low-voltage threshold; and a fourth-gain stage coupled to said third-gain stage and operable for generating said under-voltage protection signal based on said second voltage difference if said minimum indicative voltage is less than said predetermined low-voltage threshold.

18. The multi-cell battery pack protection circuit as claimed in claim 16, further comprising: a discharging switch coupled to said battery cells and said controller and operable for controlling discharging of said battery cells, wherein said controller receives said under-voltage protection signal and controls said discharging switch in response to said under-voltage protection signal.

19. The multi-cell battery pack protection circuit as claimed in claim 17, wherein said fourth-gain stage comprises N fourth-gain transistors and is operable for actuating a fourth-gain transistor corresponding to said third-gain transistor of said first to said $N^{th}$ third-gain transistor to further indicate said second voltage difference, and is further operable for generating said under-voltage protection signal if said minimum indicative voltage is less than said predetermined low-voltage threshold.

20. The multi-cell battery pack protection circuit as claimed in claim 14, wherein said indicative voltages are generated based on a plurality of resistors and a plurality of cell currents, wherein said cell currents are converted from said cell voltages, and wherein said cell currents flow through said resistors.

* * * * *